(12) United States Patent
Chen et al.

(10) Patent No.: US 12,131,896 B2
(45) Date of Patent: Oct. 29, 2024

(54) METHOD FOR WAFER BACKSIDE POLISHING

(71) Applicant: TAIWAN SEMICONDUCTOR MANUFACTURING COMPANY LTD., Hsinchu (TW)

(72) Inventors: Kei-Wei Chen, Tainan (TW); Chih Hung Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 390 days.

(21) Appl. No.: 17/461,040

(22) Filed: Aug. 30, 2021

(65) Prior Publication Data
US 2023/0064958 A1    Mar. 2, 2023

(51) Int. Cl.
| | |
|---|---|
| *H01L 21/02* | (2006.01) |
| *A46B 13/00* | (2006.01) |
| *B08B 1/12* | (2024.01) |
| *B08B 1/32* | (2024.01) |
| *B24B 7/22* | (2006.01) |

(52) U.S. Cl.
CPC ...... *H01L 21/02016* (2013.01); *A46B 13/001* (2013.01); *B08B 1/12* (2024.01); *B08B 1/32* (2024.01); *B24B 7/228* (2013.01); *H01L 21/02024* (2013.01); *H01L 21/02054* (2013.01); *A46B 2200/3073* (2013.01); *A46B 2200/3093* (2013.01)

(58) Field of Classification Search
CPC ......... H01L 21/02016; H01L 21/02024; H01L 21/02054; H01L 21/02013; H01L 21/02052; H01L 21/0209; H01L 21/67046; A46B 13/001; A46B 2200/3073; A46B 2200/3093; A46B 5/0012; B08B 1/002; B08B 1/04; B24B 7/228
See application file for complete search history.

(56) References Cited

U.S. PATENT DOCUMENTS

| | | | |
|---|---|---|---|
| 7,725,975 B2* | 6/2010 | Lee | G02F 1/1333 15/88.2 |
| 8,496,758 B2* | 7/2013 | Idani | B08B 3/04 134/2 |
| 8,752,228 B2* | 6/2014 | Farkas | H01L 21/67046 15/77 |
| 2002/0045348 A1* | 4/2002 | Arai | B24B 21/16 438/690 |
| 2007/0095367 A1* | 5/2007 | Wang | H01L 21/67046 134/33 |

(Continued)

*Primary Examiner* — Duy Vu N Deo
*Assistant Examiner* — Christopher Remavege
(74) *Attorney, Agent, or Firm* — WPAT LAW; Anthony King

(57) ABSTRACT

A method of cleaning and polishing a backside surface of a semiconductor wafer is provided. The method includes placing an abrasive brush, comprising an abrasive tape wound around an outer surface of a brush member of the abrasive brush, on the backside surface of the semiconductor wafer. The method also includes rotating the brush member to polish the backside surface of the semiconductor wafer by abrasive grains formed on the abrasive tape and to clean the backside surface of the semiconductor wafer by the brush member which is not covered by the abrasive tape.

20 Claims, 15 Drawing Sheets

(56) References Cited

U.S. PATENT DOCUMENTS

2015/0170940 A1\* 6/2015 Lin .................. H01L 21/67046
                                                          156/345.12
2017/0018422 A1\* 1/2017 Patel ........................ B08B 1/12
2020/0203192 A1\* 6/2020 Ro .......................... A46B 9/005

\* cited by examiner

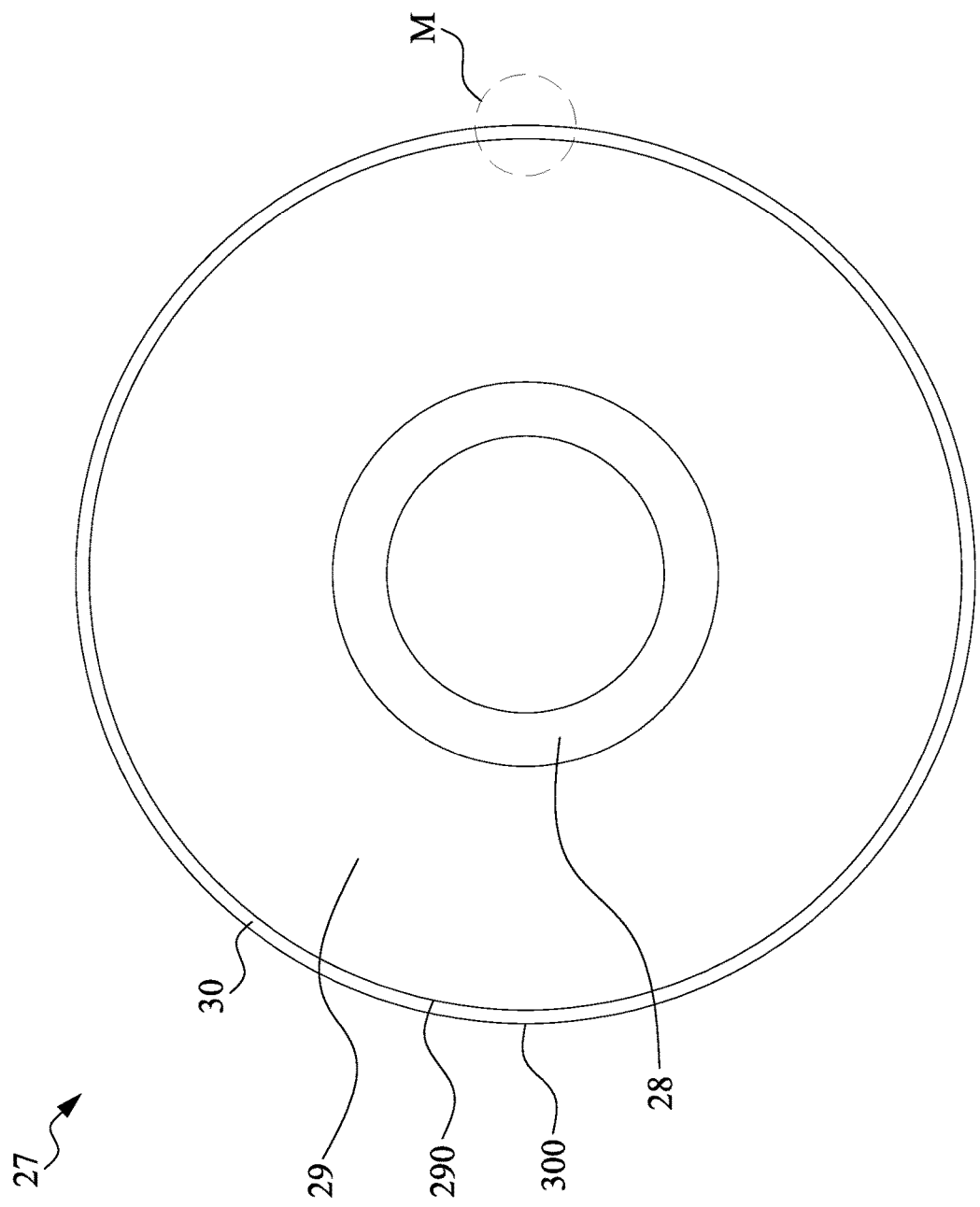

METHOD FOR WAFER BACKSIDE POLISHING

BACKGROUND

Semiconductor devices are used in a variety of electronic applications, such as personal computers, cell phones, digital cameras, and other electronic equipment. The semiconductor industry continues to improve the integration density of various electronic components (e.g., transistors, diodes, resistors, capacitors, etc.) by continual reductions in minimum feature size, which allows more components to be integrated into a given area. These smaller electronic components also require smaller packages that utilize less area than the packages of the past, in some applications.

Semiconductor fabrication includes processes which create organic and inorganic particulate byproducts which may contaminate or cross-contaminate further wafer processing. Particles on the back side of wafers can interfere with further fabrication processes such as photolithography (causing focusing defects), die tape mounting, bonding, and so forth. Although existing methods and systems for cleaning the semiconductor wafer have been generally adequate for their intended purposes, they have not been entirely satisfactory in all respects. Consequently, it would be desirable to provide a solution for cleaning the semiconductor wafer.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIG. 6A is a cross-sectional view of the abrasive brush taken along line B-B of FIG. 4, in accordance with some embodiments of the present disclosure.

DETAILED DESCRIPTION

Figure 1:
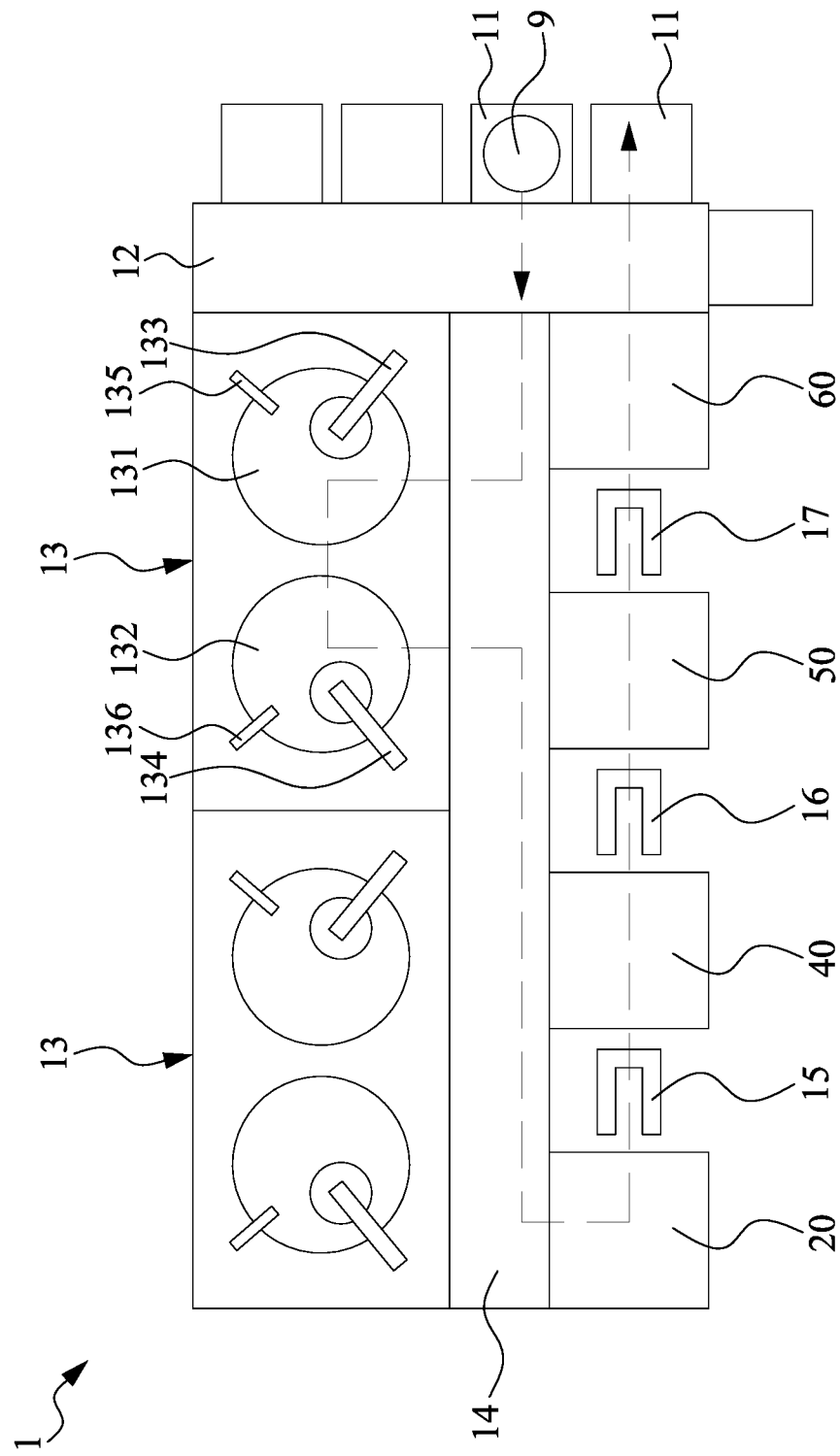
FIG. 1 is a schematic view diagram illustrating a chemical mechanical and polishing (CMP) system, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

The present disclosure is related to the field of a brush for cleaning the surface of a semiconductor wafer. More particularly, the present disclosure is related to the field of a brush for cleaning a backside of a semiconductor wafer with a use of an abrasive brush on which abrasive grains are formed for increasing a flatness of the backside of the semiconductor wafer.

FIG. 1 illustrates a chemical mechanical polishing (CMP) system 1 for processing a semiconductor wafer 9, in accordance with some embodiments. The CMP system 1 includes a number of CMP modules, such as two CMP modules 13, a number cleaning modules, such as first cleaning module 20, second cleaning module 40 and third cleaning module 50, a spin-rinse-dry (SRU) module 60, and a number of transferring tools, such as transferring tools 12, 14, 15, 16 and 17. The elements of the CMP system 1 can be added to or omitted, and the disclosure should not be limited by the embodiments.

The semiconductor wafer 9 may be made of silicon or other semiconductor materials. Alternatively or additionally, the semiconductor wafer 9 may include other elementary semiconductor materials such as germanium (Ge). In some embodiments, the semiconductor wafer 9 is made of a compound semiconductor such as silicon carbide (SIC), gallium arsenic (GaAs), indium arsenide (InAs), or indium phosphide (InP). In some embodiments, the semiconductor wafer 9 is made of an alloy semiconductor such as silicon germanium (Site), silicon germanium carbide (SiGeC), gallium arsenic phosphide (GaAsP), or gallium indium phosphide (GaInP). In some embodiments, the semiconductor wafer 9 includes an epitaxial layer. For example, the semiconductor wafer 9 has an epitaxial layer overlying a bulk semiconductor. In some other embodiments, the semiconductor wafer 9 may be a silicon-on-insulator (SOI) or a germanium-on-insulator (GOT) substrate.

The semiconductor wafer 9 may have various device elements. Examples of device elements that are formed in the semiconductor wafer 9 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, a shallow trench isolation (STI) layer, an inter-layer dielectric (ILD), or an inter-metal dielectric layer covers the device elements formed on the semiconductor wafer 9.

The transferring tools 12 and 14, e.g. robot arms, may be controlled to provide both radial and rotational movement in a fixed plane to pick up, transfer, and deliver the semiconductor wafer 9 from one location within the CMP system 1 to another. For example, with the transferring tool 12, the semiconductor wafer 9 is transferred between a carrier 11, such as a FOUP, and the transferring tool 14 or is transferred between the SID module 60 and the carrier 11 by the transferring tool 12. Additionally, with the transferring tool 14, the semiconductor wafer 9 is transferred between the CMP module 13 and the first cleaning module 20 by the transferring tool 14.

The CMP modules 13 are configured for performing a planarization process of a semiconductor wafer 9 in semiconductor manufacturing process. In some embodiments, each of the CMP modules 13 includes a first platen 131 and a second platen 132, a first polishing head 133, a second polishing head 134, a first dispenser 135 and a second dispenser 136.

The first platen 131 and the second platen 132 may be mounted on rotatable carousels (not shown in the figures). The first polishing head 133 and the second polishing head 134 are configured for holding and fixedly rotating the semiconductor wafers 9 on the first platen 131 and the second platen 132, respectively. The first dispenser 135 and the second dispenser 136 are provided over the first platen 131 and the second platen 132 for supplying slurry to surfaces of the respective first platen 131 and second platen 132.

In operation, the semiconductor wafer 9 is transferred from a carrier 11 to the first platen 131 through the transferring tool 12, transferring tool 14 and the polishing head 133 in sequence. The polishing head 133 or 134 may pick up the semiconductor wafer 9 in the transferring tool 14 for a CMP process, and place the semiconductor wafer 9 back to the transferring tool 14 after the CMP process. The semiconductor wafer 9 is processed, on the first platen 131, for a first polishing operation, and the semiconductor wafer 9 is processed, on the second platen 132, for a second polishing operation. In some embodiments, the first polishing operation and the second polishing operation differ by type and chemistry of a polishing slurry used, and process recipe such as spin rate, force applied to the semiconductor wafers 9, and duration of the polish. In some embodiments, the first polishing operation may be a rough polish and the second polishing operation may be a fine polish. In some embodiments, the first polishing operation may be configured to remove dielectric material from the semiconductor wafers 9 and the second polishing operation may be configured to remove metal.

The first cleaning module 20, the second cleaning module 40, the third cleaning module 50 and the SRD module 60 are configured to clean or polish the semiconductor wafers 9 after chemical mechanical polishing. In some embodiments, after the semiconductor wafer 9 is cleaned by one of the cleaning modules, the transferring tools 15, 16 and 17 transfer the semiconductor wafer 9 from one cleaning module to the adjacent cleaning module for a next cleaning process.

Figure 2:
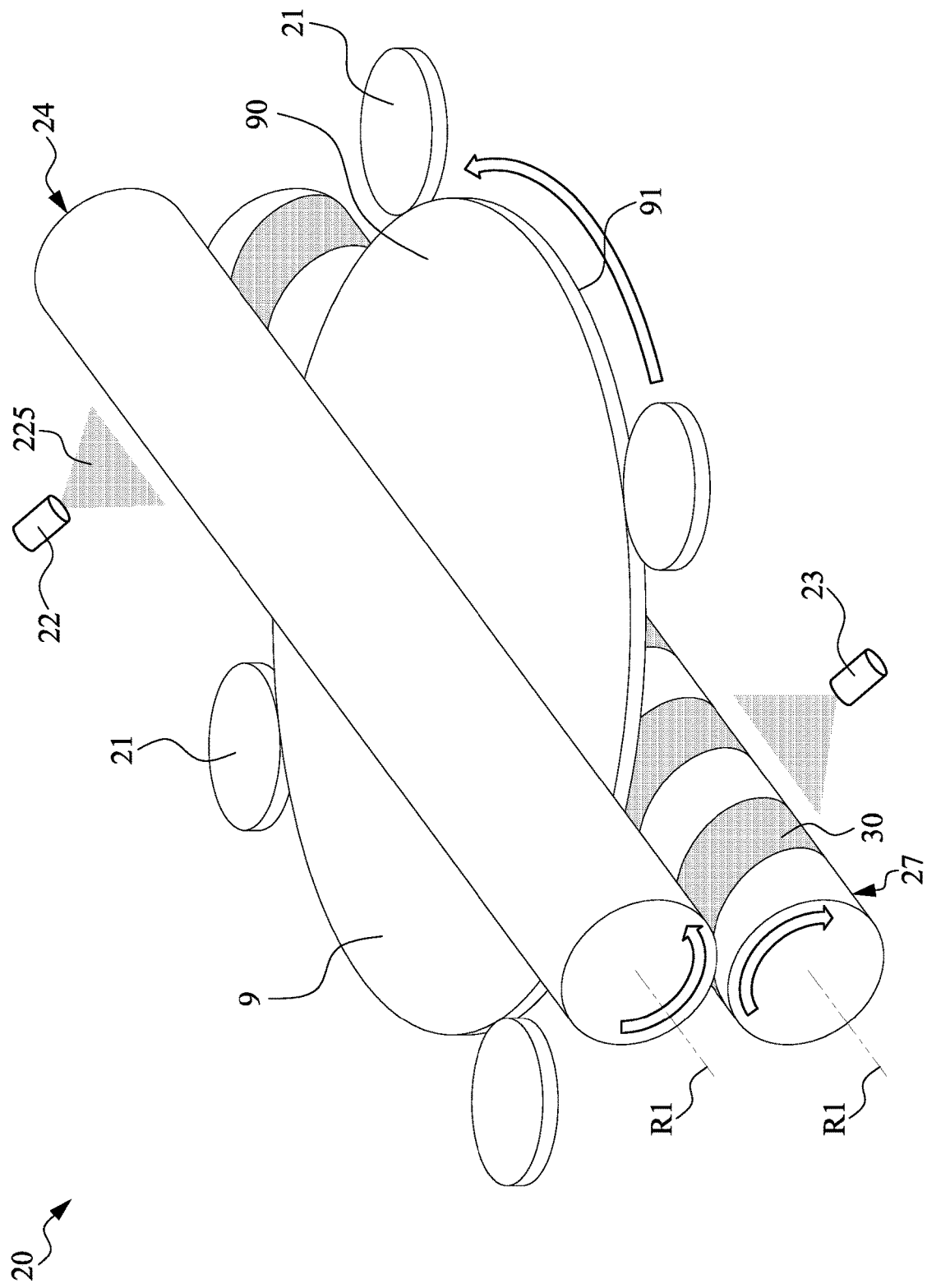
FIG. 2 is a schematic view diagram illustrating a cleaning module, in accordance with some embodiments of the present disclosure.

FIG. 2 is a schematic view diagram illustrating the first cleaning module 20, in accordance with some embodiments of the present disclosure. In some embodiments, the cleaning module 20s includes a number of rollers 21, a number of nozzles 22 and 23, a cleaning brush 24, and an abrasive brush 27. The rollers 21 are configured to drive a rotation of the semiconductor wafer 9. When the semiconductor wafer 9 is positioned in the first cleaning module 20, one or more rollers 21 are actuated to move so as to abut against an edge of the semiconductor wafer 9 and then driven to rotate so as to control the rotation of the semiconductor wafer 9. The cleaning brush 24 is positioned over the semiconductor wafer 9 and used for cleaning a front-side surface of the semiconductor wafer 9. The abrasive brush 27 is positioned underneath the semiconductor wafer 9 and used for cleaning a backside surface of the semiconductor wafer 9. The cleaning brush 24 and the abrasive brush 27 extends along respective rotation axes R1 and R2. When the semiconductor wafer 9 is cleaned in the first cleaning module 20, the cleaning brush 24 and the abrasive brush 27 are rotated about the rotation axes R1 and R2 to clean and polish the semiconductor wafer 9. The rotation axis R1 may be parallel to the rotation axis R2. In some embodiments, during the cleaning process, the cleaning brush 24 and the abrasive brush 27 are vertically aligned with each other. A projection of the cleaning brush 24 in a direction that is perpendicular to the semiconductor wafer 5 overlaps with the abrasive brush 27.

The nozzle 22 and the nozzle 23 are positioned relative to the front-side surface and the backside surface of the semiconductor wafer 9, respectively. The nozzles 22 and the nozzle 23 are used to spray cleaning liquid, such as deionized water (DM') or citric acid, over the semiconductor wafer 9 to remove contaminations or residues on the semiconductor wafer 9. In some embodiments, the cleaning liquid from the nozzle 22 and the nozzle 23 are supplied over the cleaning brush 24 and the abrasive brush 27 respectively so as to remove contaminations or residues accumulated on the cleaning brush 24 and the abrasive brush 27.

Figure 3:
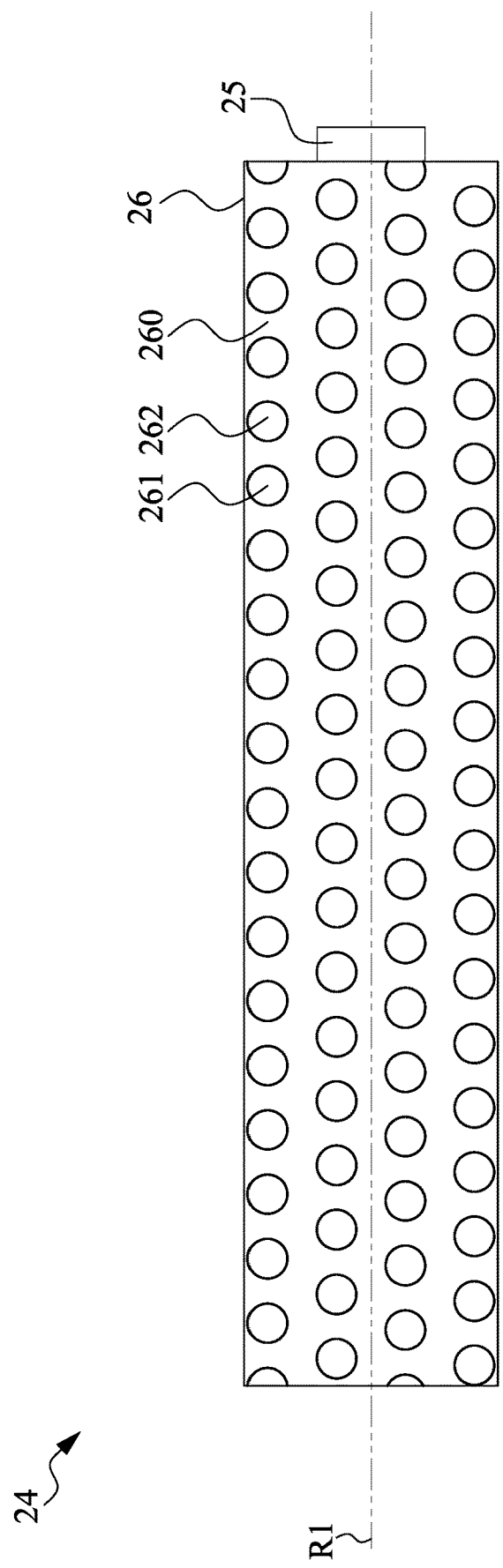
FIG. 3 is a schematic view diagram illustrating a cleaning brush, in accordance with some embodiments of the present disclosure.

FIG. 3 is a schematic view diagram illustrating the cleaning brush 24, in accordance with some embodiments of the present disclosure. In some embodiments, the cleaning brush 24 includes a rotation shaft 25 and a brush member 26. The rotation shaft 25 may be a hollowed cylinder. The brush member 26, for example, includes a sponge and is pliable and soft. In some embodiments, the brush member 26 circumferentially surrounds the rotation shaft 25. As shown in FIG. 3, an end of the rotation shaft 25 is not covered by the brush member 26. The rotation shaft 25 may be held by a cap (not shown in figures) which is configured to drive the rotation shaft 25 to rotate. In some embodiments, a number of protruding structures, such as protruding structures 261 and 262, are formed in rows on an outer surface 260 of the brush member 26. The protruding structures 261 and 262 in the same row are arranged along a direction that is parallel to the rotation axis R1. The protruding structures in different rows are arranged in a staggered manner. The protruding structures may be formed integrally with the brush member 26 and have a circular edge as seen from a direction that is perpendicular to the rotation axis R1 (i.e., radial direction.) In some embodiments, there is no abrasive grain located on the outer surface 260 of the brush member 26.

Figure 4:
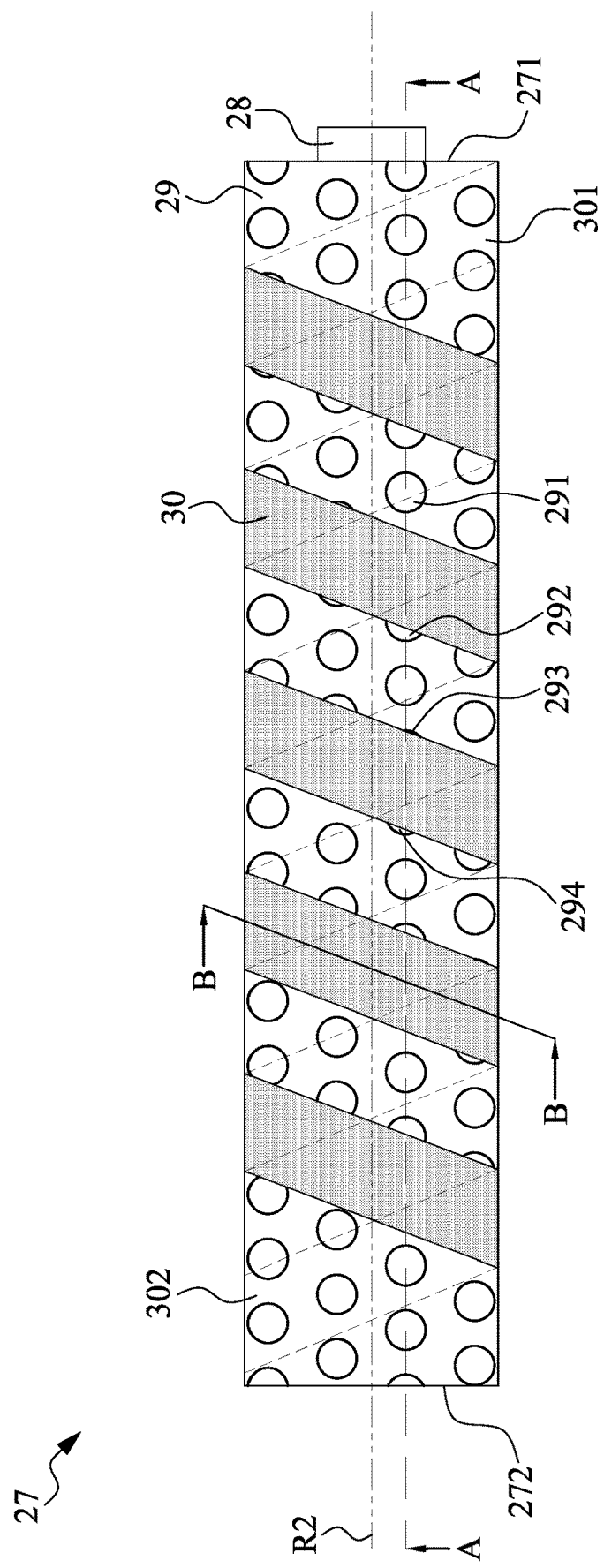
FIG. 4 is a schematic view diagram illustrating an abrasive brush, in accordance with some embodiments of the present disclosure.
Figure 5:
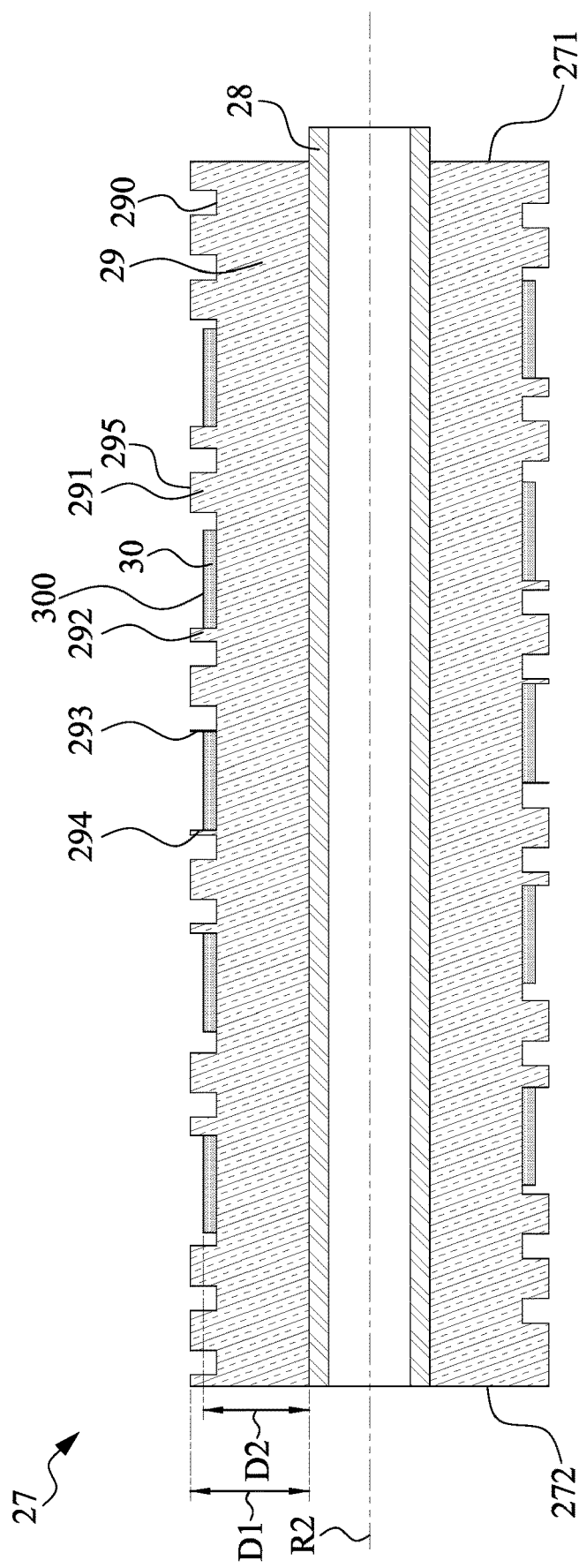
FIG. 5 is a cross-sectional view of the abrasive brush taken along line A-A of FIG. 4, in accordance with some embodiments of the present disclosure.

FIG. 4 is a schematic view diagram illustrating the cleaning brush 27, in accordance with some embodiments of the present disclosure. FIG. 5 is a cross-sectional view of the abrasive brush 27 taken along line A-A of FIG. 4, in accordance with some embodiments of the present disclosure. In some embodiments, the cleaning brush 27 includes a rotation shaft 28, a brush member 29 and an abrasive tape 30.

The rotation shaft 28 may be a hollowed cylinder. The brush member 29, for example, includes a sponge and is pliable and soft. In some embodiments, the brush member 29 circumferentially surrounds the rotation shaft 28. As shown in FIG. 4, an end of the rotation shaft 28 is not covered by the brush member 29. The rotation shaft 28 may be held by a cap (not shown in figures) which is configured to drive the rotation shaft 28 to rotate. In some embodiments, a number of protruding structures, such as protruding structures 291, 292, 293 and 294, are formed in rows on an outer surface 290 of the brush member 29. The protruding structures 291, 292, 293 and 294 in the same row are arranged along a direction that is parallel to the rotation axis R2. The protruding structures in different rows are arranged in a staggered manner.

In some embodiments, the abrasive tape 30 has a strip shape and is wound into a helical shape surrounding the outer surface 290 of the brush member 29. In some embodiments, a portion of the outer surface 290 of the brush member 29 which is to be covered by the abrasive tape 30 is free of the protruding structure. For example, in the embodiment shown in FIG. 4, the abrasive tape 30 attached to the outer surface 290 of the brush member 29 is wound into a helical shape with one end 301 located adjacent to a proximal end 271 of the brush member 29 and the other end 302 located adjacent to a distal end 272 of the brush member 29. The region covered by the abrasive tape 30 is free of the protruding structure. Therefore, the abrasive tape 30 is directly in contact with the outer surface 290 of the brush member 29 and is attached conformally on the outer surface 790.

However, it will be appreciated that many variations and modifications can be made to embodiments of the disclosure. In some other embodiments, the protruding structures on the brush member 29 are arranged in the same manner as the protruding structures on the brush member 27 as shown in FIG. 3, and the abrasive tape 30 is attached on the protruding structures on the brush member 29.

In some embodiments, the configurations of the protruding structures are varied according to an arrangement of the abrasive tape 30. For example, as shown in FIGS. 4 and 5, since the brush member 29 is wound into a helical shape, some of the protruding structures of the protruding structures (e.g., protruding structures 292, 293 and 294), which are immediately adjacent to the region on which the abrasive tape 30 located, have flat side surfaces as seen from a direction that is perpendicular to the rotation axis R2 (i.e., radial direction). When the abrasive tape 30 surrounds the brush member 29, the edge of the abrasive tape 30 abuts against the flat sides of the protruding structures 292, 293 and 294 as shown in FIG. 5. For the protruding structures (e.g., protruding structure 291) which are distant from the region on which the abrasive tape 30 located, has a circular edge as seen from the radial direction. As a result, the protruding structures on the brush member 29 may have different shapes and cross-sectional areas.

The pitches (i.e., a height of one complete helix turn measured parallel to the rotation axis R2) of the helical shape of the abrasive tape 30 can be varied. A smaller pitches may demonstrate a higher efficiency for removing material from the backside surface of the semiconductor wafer 9, and vise versa. In some other embodiments, there are two abrasive tapes 30 connected to the outer surface 290 of the brush member 29, and the two abrasive tapes 30 are wound into helical shape and surrounds the rotation axis R2 but differing by a translation along the rotation axis R2.

It will be noted that the way in which the abrasive tape 30 is wound on the outer surface 290 of the brush member can be varied according to demands. For example, the brush member 29 may be wound in different patterns such as cross-hatch, polka-dots, etc., and the configurations of the protruding structures are varied accordingly.

In some embodiments, a thickness of the protruding structures on the brush member 29 is greater than that of the abrasive tape 30. For example, as shown in FIG. 5, a thickness D1 of the protruding structure 291 is greater than a thickness D2 of the abrasive tape 30. As a result, an outer surface 295 of the protruding structure is higher than an outer surface 300 of the abrasive tape 30 relative to the outer surface 290 of the brush member 29. Therefore, when the abrasive brush 27 is used to clean and polish a backside surface of the semiconductor wafer 9, the outer surface 295 of the protruding structure may be in contact with the backside surface of the semiconductor wafer 9 earlier than the outer surface 300 of the abrasive tape 30.

Figure 6B:
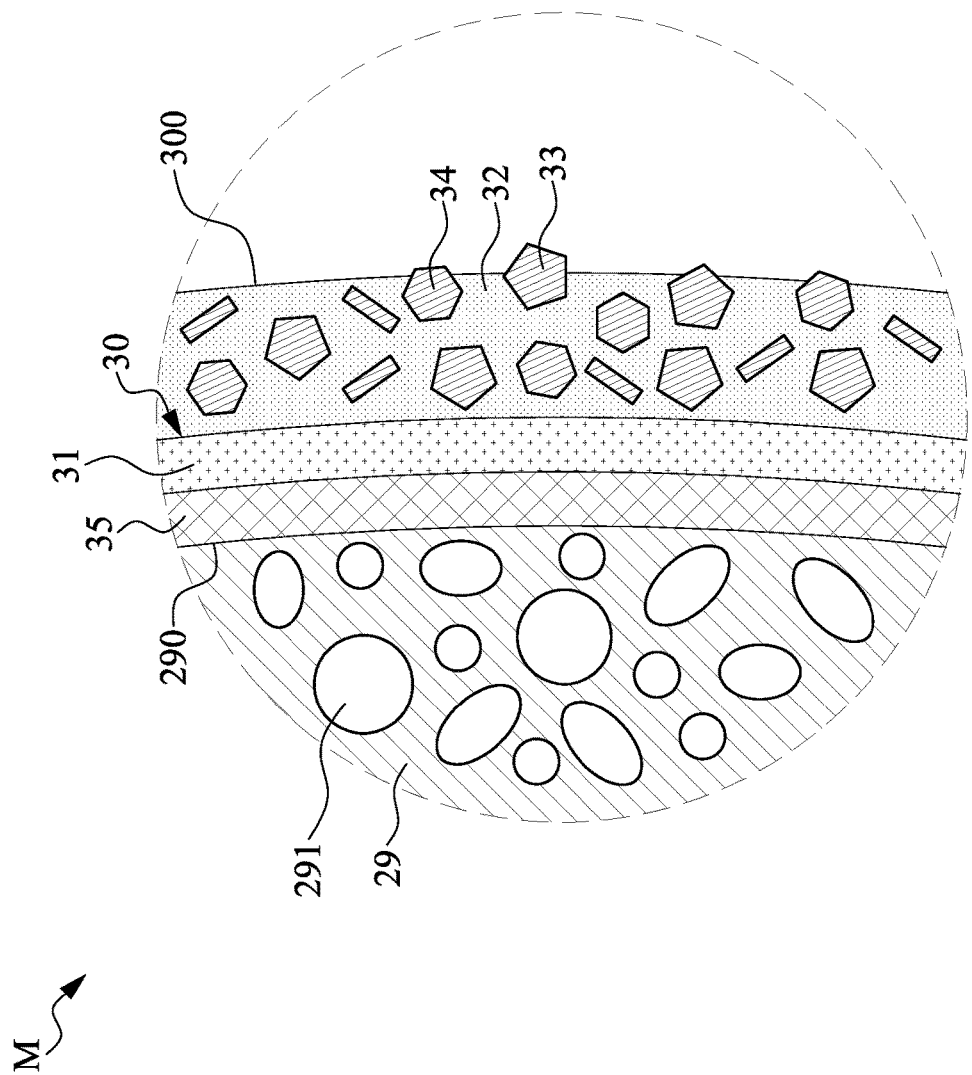
FIG. 6B is a magnified view of a selected region M in FIG. 6A, in accordance with some embodiments of the present disclosure.

FIG. 6A is a cross-sectional view of the abrasive brush 27 taken along line B-B of FIG. 4, in accordance with some embodiments of the present disclosure. FIG. 613 is a magnified view of a selected region M in FIG. 6A, in accordance with some embodiments of the present disclosure. In some embodiments, the abrasive tape 30 includes a substrate 31, a bonding material 32, a number of abrasive grains, such as abrasive grains 33 and 34, and an adhesive film 35. The substrate 31 may be made of a pliable plastic material. The bonding material 32 is formed on an outer surface of the substrate 31. The abrasive grains 33 and 34 may be formed of diamond, CeO2, or the like and dispersed in the bonding material 32. The hardness of the abrasive grains 33 and 34 may be less or greater than that of a material of the semiconductor wafer 9. The abrasive grains 33 and 34 may be formed with different shapes and sizes with one or more sharp angles for polishing purpose. The adhesive film 35 is formed on an inner surface of the substrate 31. The abrasive tape 30 is connected to the outer surface 290 of the brush member 290 by the adhesive film 35. As shown in FIG. 6B, the brush member 290 may be made of a porous material with a number of voids formed therein.

The second cleaning module 40 and the third cleaning module 50 may be the same or different from the first cleaning module 30. For example, the second cleaning module 40 has a configuration as shown in FIG. 2, and the third cleaning module 50 has a configuration similar to that shown in FIG. 2 while the abrasive brush 27 is replaced with the cleaning brush 24. Alternatively, each of the second cleaning module 40 and the third cleaning module 50 has a configuration similar to that shown in FIG. 2 while the abrasive brush 27 is replaced with the cleaning brush 24.

Figure 7:
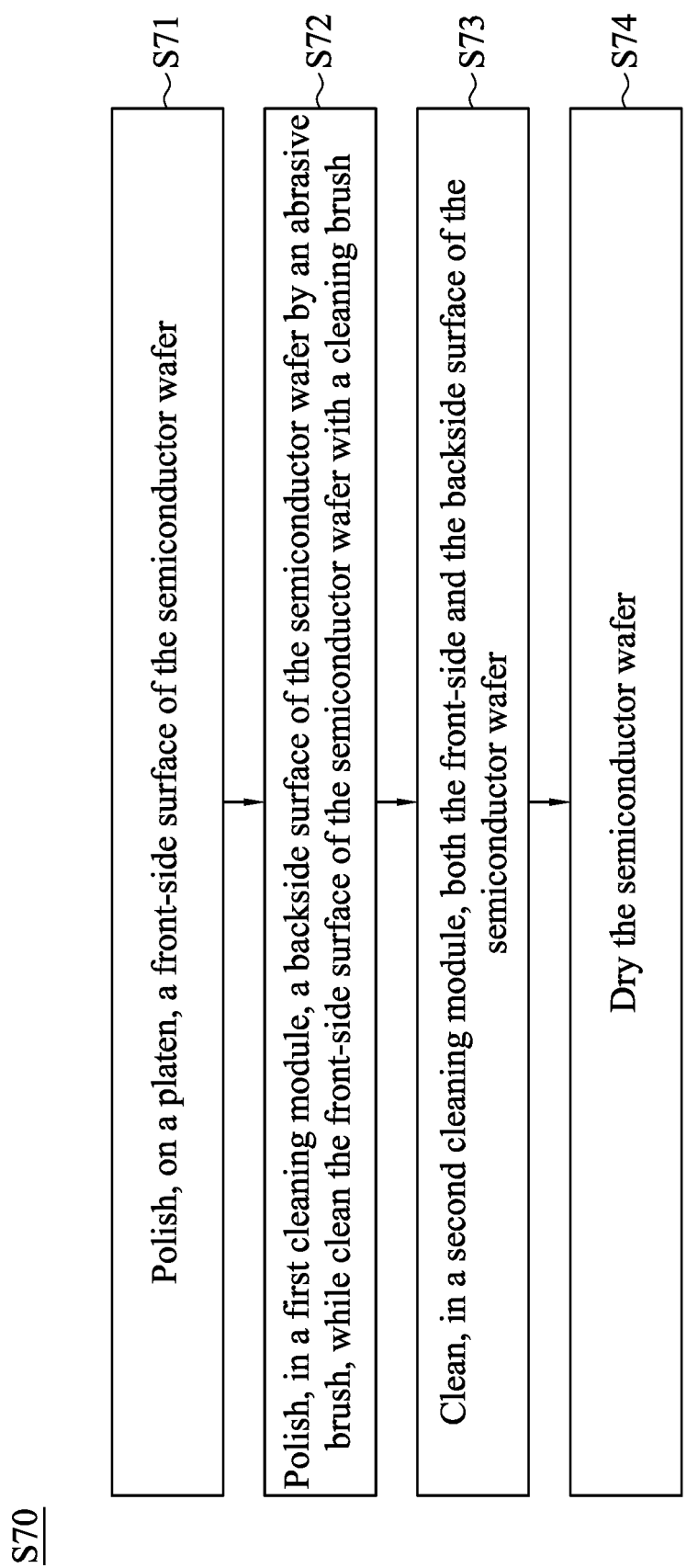
FIG. 7 is a flow chart illustrating a method for performing a CMP process, in accordance with various aspects of one or more embodiments of the present disclosure.

FIG. 7 is a flow chart illustrating a method S70 for performing a CMP process, in accordance with various aspects of one or more embodiments of the present disclosure. For illustration, the flow chart will be described along with the drawings shown in FIGS. 1, 2 and 8-10. Some of the described stages can be replaced or eliminated in different embodiments.

The method S70 includes operation 571, in which the front-side surface 90 of the semiconductor wafer 9 is polished on a platen in the CMP module 13. In some embodiments, to load the semiconductor wafer 9 on the CMP module 13, the semiconductor wafer 9 may be transferred from the carrier 11 to the transferring tool 14 via the transferring tool 12, and the first polishing head 133 moves the semiconductor wafer 9 from the transferring tool 14 to the first platen 131 for a first polishing operation. When the semiconductor wafer 9 is held by the first polishing head 133, the front-side surface 90 of the semiconductor wafer 9 faces downwardly. After the first polishing operation, the first polishing head 133 moves the semiconductor wafer 9 back to the transferring tool 14, and the second polishing had 134 may transfer the semiconductor wafer 9 to the second platen 132 for a second polishing operation. After the second polishing operation, the second polishing head 134 moves the semiconductor wafer 9 back to the transferring tool 14, and the semiconductor wafer 9 is then transferred to the first cleaning module 20 by the transferring tool 14.

Figure 8:
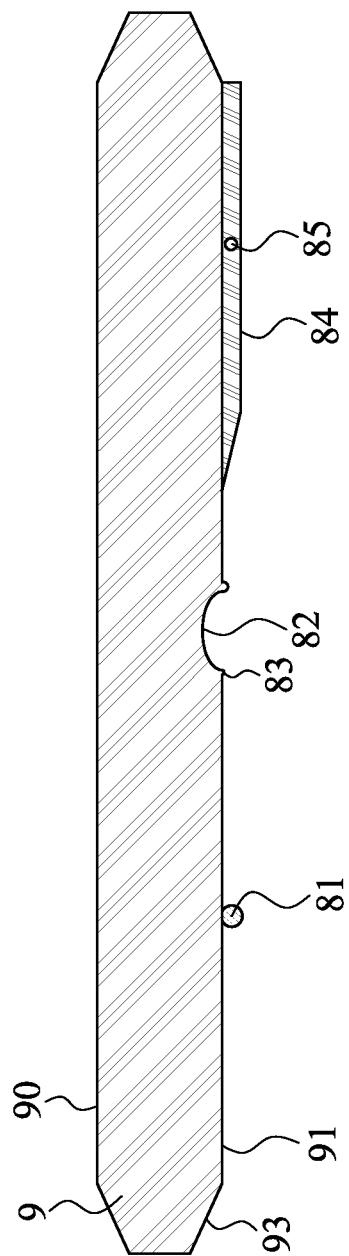
FIG. 8 is a cross-sectional view of a semiconductor wafer before being processing with a cleaning process, in accordance with some embodiments of the present disclosure.

In some embodiments, as shown in FIG. 8, after the CMP process, polishing residues 81 may be presented on the back side surface 91 of the semiconductor wafer 9. In addition, dimples 82 may be formed on the back side surface 91 of the semiconductor wafer 9 due to an improper external force applied on the semiconductor wafer 9. For example, a wafer chuck (not shown in figures) for a previous process, such as etching, may use excessive force to fix the semiconductor wafer 9 and adversely causes a dimple 82 on the back side surface 91 of the semiconductor wafer 9. The presence of the dimple 82 is usually accompanied with bumps 83 on an edge of the dimple 82. Moreover, a particle 85 may be attached on the back side surface 91 of the semiconductor wafer 9 by a film 84 (e.g., oxide layer) form in a deposition process which is previously performed. If the residues 81, the bumps 83 and the particle 85 (collectively referred to as local high points) on the back side surface 91 are not properly handled, a photoresist layer may be exposed with an out-of-focus radiation in a following lithography process, which thereby leads to a yield degradation of the semiconductor wafer 9. To address the problem above, the method continues with operation S72.

In operation 872, the backside surface 91 of the semiconductor wafer 9, in the first cleaning module 20, is polished and cleaned by the abrasive brush 27, while the front-side surface 90 of the semiconductor wafer 9 is cleaned by the cleaning brush 24. In some embodiments, as shown in FIG. 2, before the operation S72, the semiconductor wafer 9 is placed between the cleaning brush 24 and the abrasive brush 27 and held by rollers 21. To perform operation S72, the cleaning brush 24 and the abrasive brush 27 are actuated to rotate, the semiconductor wafer 9 is also rotated by the rollers 21, and clean liquid 225 and 235 are supplied over the semiconductor wafer 9. The time period for performing the operation of cleaning and polishing the semiconductor wafer 9 by the cleaning brush 24 and the abrasive brush ranges from about 20 seconds to about 80 seconds, for example. With the rotation of the abrasive brush 27, the back side surface 91 of the semiconductor wafer 9 is polished by the abrasive grains 33 and 34 of the abrasive tape 30, and the local high points can be directly or gradually removed.

Figure 9:
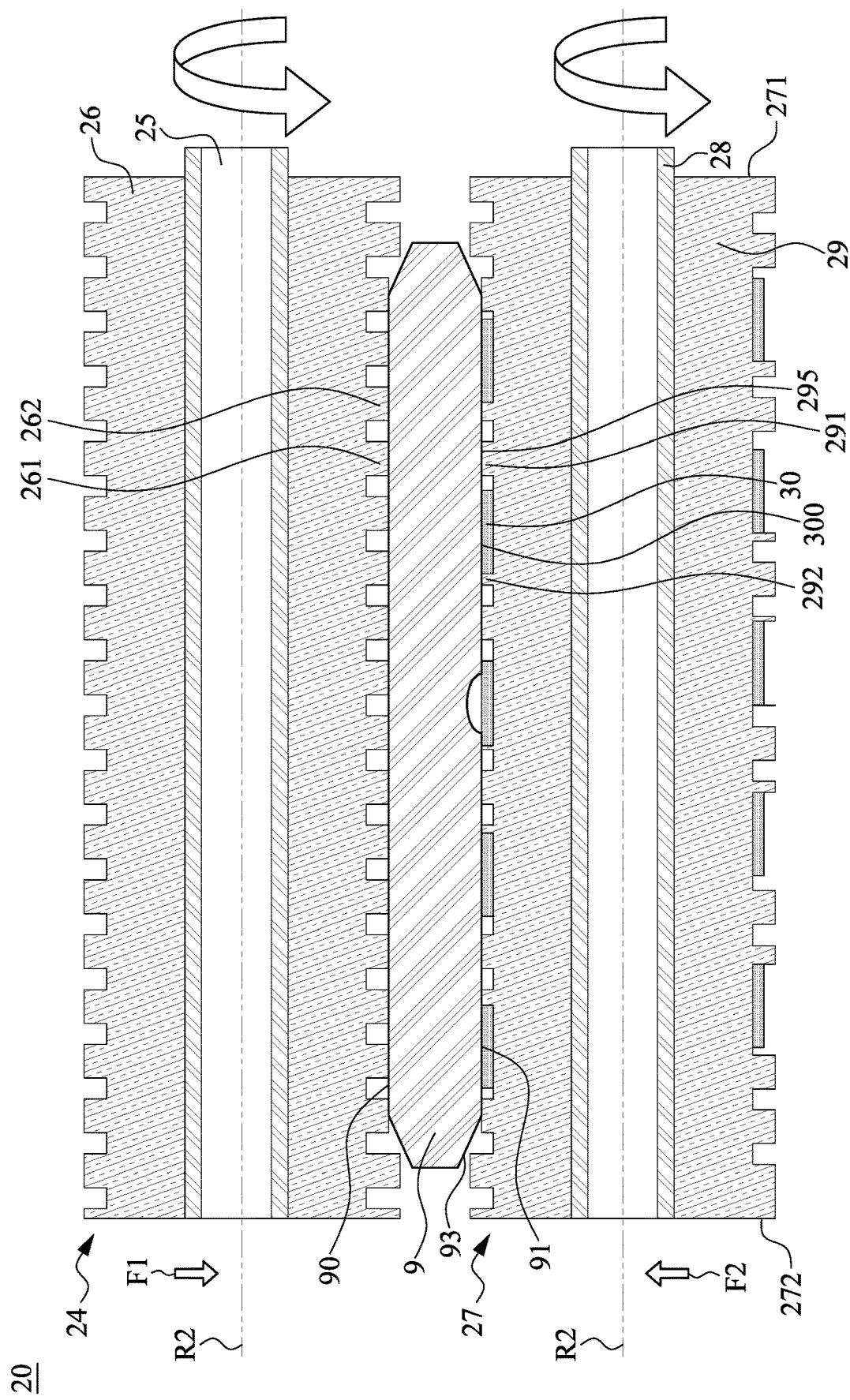
FIG. 9 is a cross-sectional view illustrating one stage of a method for performing a cleaning process at which both a front-side and backside of a semiconductor wafer are cleaned by a cleaning brush and an abrasive brush, in accordance with one or more embodiments of the present disclosure.

In some embodiments, as shown in FIG. 9, during operation S72, the cleaning brush 24 is applied with a force F1 toward the abrasive brush 27, and the abrasive brush 27 is applied with a force F2 toward the cleaning brush 24 such that the front-side surface 90 and the backside surface 91 of the semiconductor wafer 9 are ensured to be in contact with the cleaning brush 24 and the abrasive brush 27. In some embodiments, the thrust force F2 applied to the abrasive brush 27 is greater than the thrust force F1 applied to the cleaning brush 24. As a result, the backside surface 91 of the semiconductor water 9 can be polished by the abrasive tape 30 of the abrasive brush with higher polishing efficiency, which means the local high points on the backside surface 91 may be removed efficiently. It will be understood that this unequal force will not cause a movement of the semiconductor wafer 9 because the semiconductor wafer 9 is held by the rollers 21 (FIG. 2).

In some embodiments, a rotation speed of the cleaning brush 24 about the rotation axis R1 is different from a rotation speed of the abrasive brush 27 about the rotation axis R2. For example, the rotation speed of the abrasive brush 27 may be slower than the rotation speed of the cleaning brush 24 while a greater force is applied to the abrasive brush 27 toward the semiconductor wafer 9 than on the cleaning brush 24. Alternatively, the rotation speed of the abrasive brush 27 may be faster than the rotation speed of the cleaning brush 24 while an equal force is applied to the abrasive brush 27 and the cleaning brush 24 toward the semiconductor wafer 9. However, it will be appreciated that many variations and modifications can be made to embodiments of the disclosure. In some other embodiments, the rotation speed of the abrasive brush 27 is the same as the rotation speed of the cleaning brush 24. In some other embodiments, the cleaning brush 24 and the abrasive brush 27 rotate in opposite directions, e.g., one in clockwise direction and another one in counterclockwise direction.

In some embodiments, in operation S72, both the abrasive tape 30 and the protruding structures are in contact with the backside surface 91 of the semiconductor wafer 9. For example, as shown in FIG. 9, after the abrasive brush 27 is compressed on the backside surface 91 of the semiconductor wafer 9, the protruding structures 291 and 292 are pressed to deform, and thus the outer surface 295 of the protruding structures 291 and 292 and the outer surface 300 of the abrasive tape 30 are both located on the backside surface 91 of the semiconductor wafer 9. In some embodiments, the outer surface 290 of the brush member 29 is in contact with the backside surface 91 of the semiconductor wafer 9 to clean the backside surface 91 of the semiconductor wafer 9. Therefore, the backside surface 91 of the semiconductor wafer 9 are polished by the abrasive tape 30 and cleaned by the brush member 29 and protruding structures (e.g. protruding structures 291 and 292) simultaneously.

In some embodiments, a bottom bevel edge 93 of the semiconductor wafer 9 is also polished and cleaned by the abrasive brush 27. In some embodiments, as shown in FIG. 9, the brush member 29 extends across the semiconductor wafer 9 from the proximal end 271 to the distal end 272. In addition, one end 301 of the abrasive tape 30 is located adjacent to the proximal end 271 of the brush member 29 and the other end 302 of the abrasive tape 30 is located adjacent to the distal end 272 of the brush member 29. Accordingly, the bottom bevel edge 93 can be polished by the abrasive tape 30 during operation S72. In some embodiments, due to a pliable property of the brush member 29, two end portions next to the proximal end 271 and the distal end 272 are bent toward the semiconductor wafer 9. As a result, the abrasive tape 30 and the protruding structures are in contact with the bottom bevel edge 93 of the semiconductor wafer 9 during operation S72.

Figure 10:
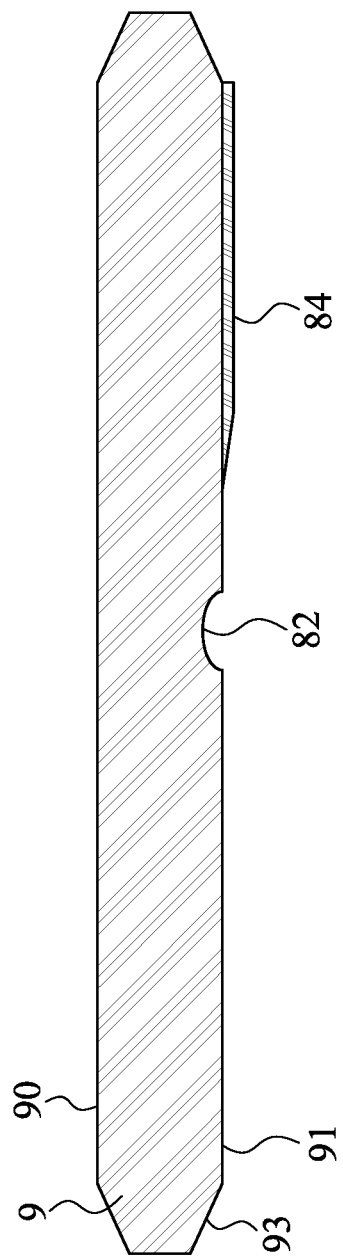
FIG. 10 is a cross-sectional view of a semiconductor wafer after being processing with a cleaning process, in accordance with some embodiments of the present disclosure.

In some embodiments, as shown in FIG. 10, after operation S72, the local high points on the back side surface 91 of the semiconductor wafer 9 are removed, and thus the concern that a photoresist layer may be exposed with an out-of-focus radiation in a following lithography process is be mitigated or prevented.

The method S70 also includes operation S73, in which, both the front-side 90 and the backside surface 91 of the semiconductor wafer 9 are cleaned in the second cleaning module 40. In some embodiments, after operation S72 is completed, the semiconductor wafer 9 is transferred from the first cleaning module 20 to the second cleaning module 40 (FIG. 2). In the second cleaning module 40, the semiconductor wafer 9 is placed between two brushes for a cleaning process. In the embodiment where the two brushes are both cleaning brushes similar to the cleaning brush 24 in FIG. 3, both the front-side surface 90 of the semiconductor wafer 9 and the backside 91 of the semiconductor wafer 9 are cleaned by the cleaning brushes 24. No polishing process is performed in the second cleaning module 40. In embodiment where the second cleaning module 40 has a configuration as shown in FIG. 2, the backside surface 91 of the semiconductor wafer 9, in the first cleaning module 40, is polished and cleaned by the abrasive brush 27, while the front-side surface 90 of the semiconductor wafer 9 is cleaned by the cleaning brush 24. Operation S73 may be performed once by the second cleaning module 40. Alternatively, operation S73 may be performed twice by the second cleaning module 40 and the third cleaning module 50.

The method S70 also includes operation S74, in which the semiconductor wafer 9 is dried after being cleaned for multiple times. In some embodiments, after the semiconductor wafer 9 is cleaned by the first cleaning module 20, the second cleaning module 40 and the third cleaning module 50, the semiconductor wafer 9 is transferred to the SRD module 60. When the semiconductor wafer 9 is transferred to the SRI) module 60, the semiconductor wafer 9 is rinsed with deionized water and then dried before being transferred to the carrier 11.

The configuration of the abrasive brush 27 should not be limited to the embodiments above. Some exemplary embodiments of the abrasive brush are described below.

Figure 11:
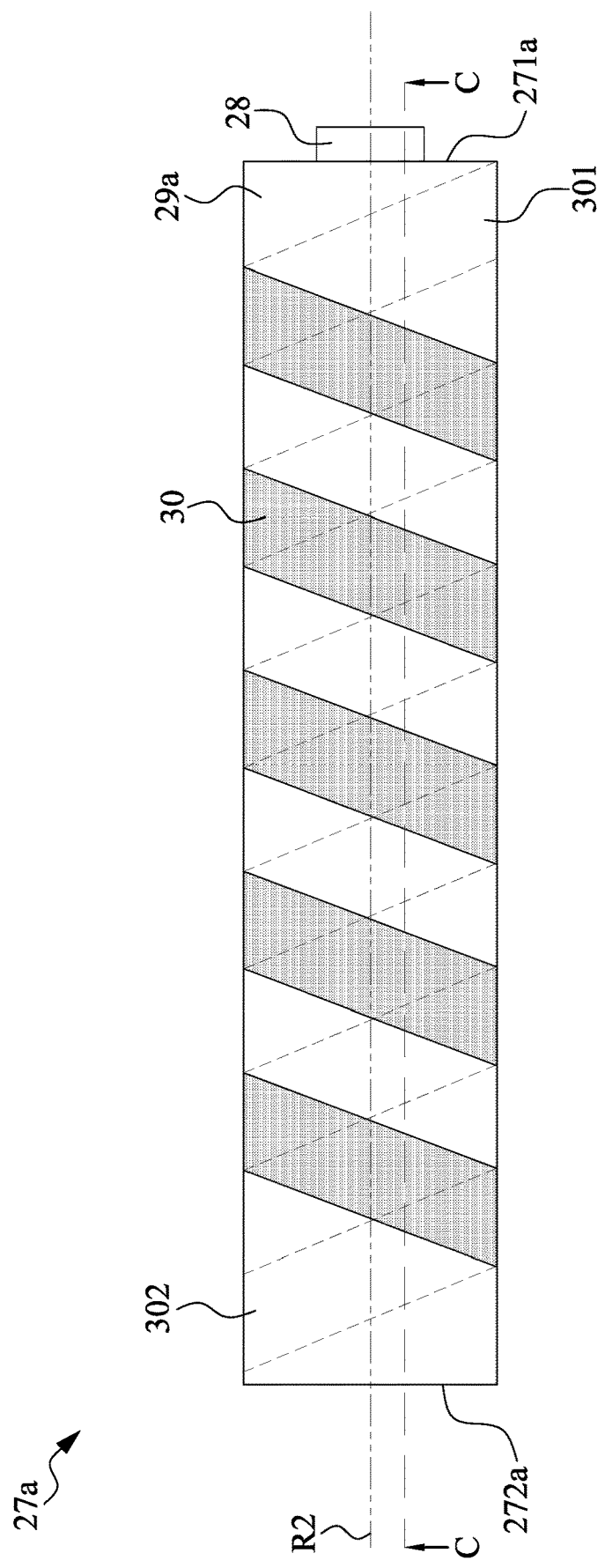
FIG. 11 is a schematic view diagram illustrating an abrasive brush, in accordance with some embodiments of the present disclosure.
Figure 12:
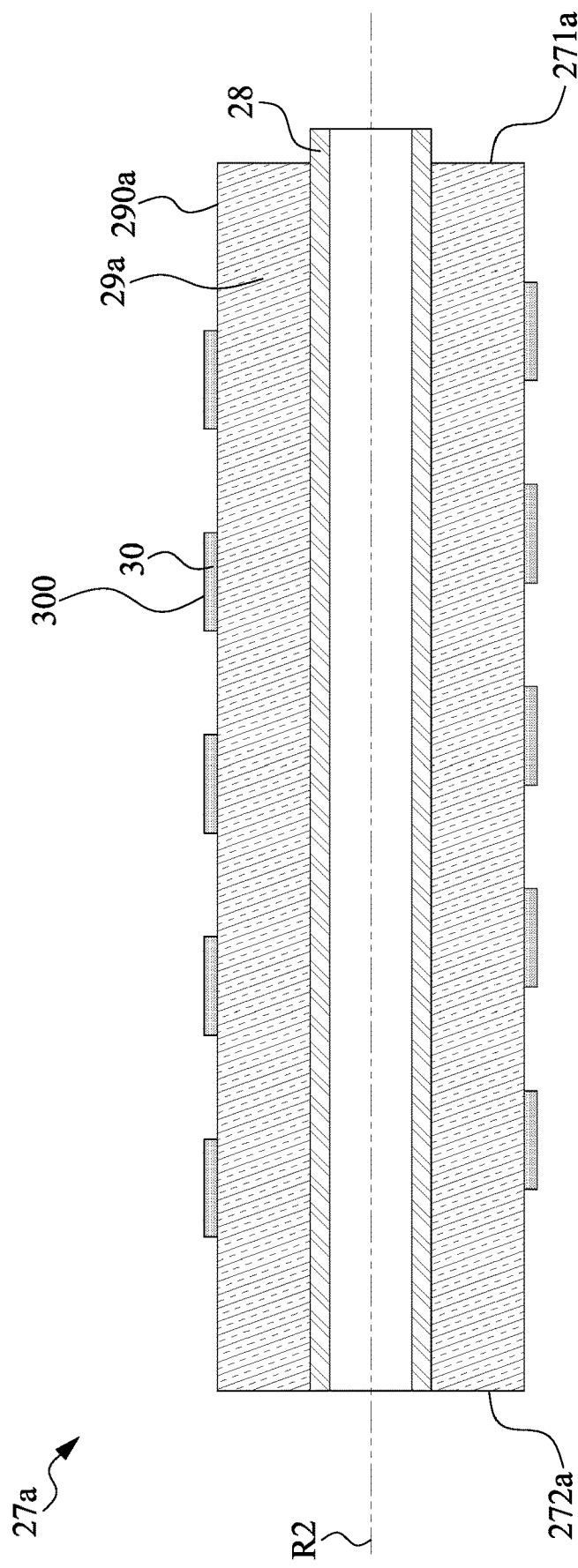
FIG. 12 is a cross-sectional view of an abrasive brush taken along line C-C of FIG. 11, in accordance with some embodiments of the present disclosure.

FIG. 11 is a schematic view diagram illustrating an abrasive brush 27a, in accordance with some embodiments of the present disclosure. FIG. 12 is a cross-sectional view of the abrasive brush 27a taken along line C-C of FIG. 11, in accordance with some embodiments of the present disclosure. The components in FIGS. 11 and 12 that use the same reference numerals as the components of FIGS. 4 and 5 refer to the same components or equivalent components thereof. For the sake of brevity, it will not be repeated here. Differences between the abrasive brush 27a and the abrasive brush 27 include the brush member 29 being replaced with a brush member 29a.

The brush member 29a, for example, includes a sponge and is pliable and soft. In some embodiments, the brush member 29a circumferentially surrounds the rotation shaft 28. In some embodiments, there is no protruding structure formed on an outer surface 290a of the brush member 29a. The outer surface 290a of the brush member 29a is a flat curved surface.

In some embodiments, the abrasive tape 30 attached to the outer surface 290a of the brush member 29a is wound into a helical shape with one end 301 located adjacent to a proximal end 271a of the brush member 29a and the other end 302 located adjacent to a distal end 272a of the brush member 29a. Since there is no protruding structure formed on the outer surface 290a of the brush member 29a, the abrasive tape 30 is directly in contact with the outer surface 290 of the brush member 29 and is attached conformally on the outer surface 290. It will be noted that the way in which the abrasive tape 30 is wound on the outer surface 290a of the brush member can be varied according to demands. For example, the brush member 29a may be wound in different patterns such as cross-hatch, polka-dots, etc., and the configurations of the protruding structures are varied accordingly.

Figure 13:
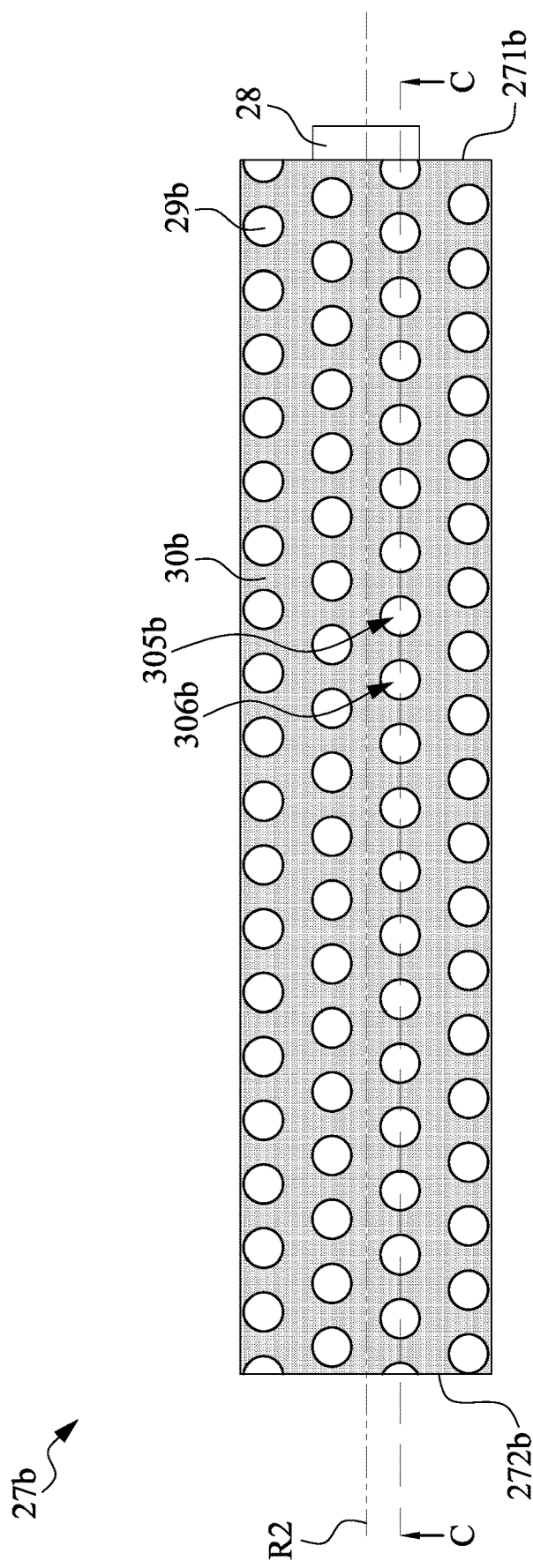
FIG. 13 is a schematic view diagram illustrating an abrasive brush, in accordance with some embodiments of the present disclosure.
Figure 14:
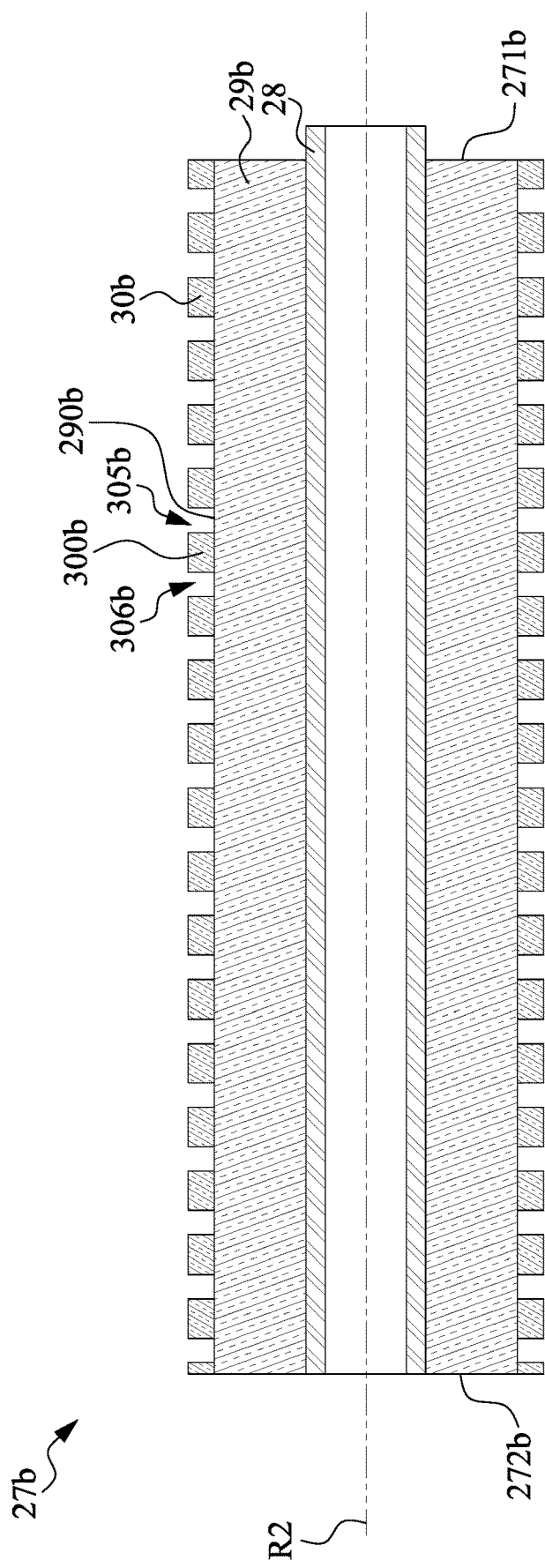
FIG. 14 is a cross-sectional view of an abrasive brush taken along line D-D of FIG. 13, in accordance with some embodiments of the present disclosure.

FIG. 13 is a schematic view diagram illustrating an abrasive brush 27b, in accordance with some embodiments of the present disclosure. FIG. 14 is a cross-sectional view of the abrasive brush 27b taken along line D-D of FIG. 13, in accordance with some embodiments of the present disclosure. The components in FIGS. 13 and 14 that use the same reference numerals as the components of FIGS. 4 and 5 refer to the same components or equivalent components thereof. For the sake of brevity, it will not be repeated here. Differences between the abrasive brush 27b and the abrasive brush 27 include the brush member 29 being replaced with a brush member 29a and the abrasive tape 30 being replaced with abrasive tape 30b.

The brush member 29b, for example, includes a sponge and is pliable and soft. In some embodiments, the brush member 29b circumferentially surrounds the rotation shaft 28. In some embodiments, there is no protruding structure formed on an outer surface 290b of the brush member 29b. The outer surface 290b of the brush member 29b is a flat curved surface.

In some embodiments, the abrasive tape 30b has a rectangular shape. The abrasive tape 30b surrounds the brush member 29b and is connected to the outer surface 290b of the brush member 29b. Two opposite edges of the abrasive tape 30b are arranged to align with the proximal end 271b and the distal end 272b. A number of through holes, such as through holes 305b and 306b, are formed in rows on the abrasive tape 30b. The through holes in the same row are arranged along a direction that is parallel to the rotation axis R2. The through holes in different rows are arranged in a staggered manner. After the abrasive tape 30b is attached to the outer surface 290b of the brush member 29b, the outer surface 290b of the brush member 29b is exposed by the through holes of the abrasive tape 30b.

It will be appreciated that, while, in the above descriptions, the abrasive brush 27 is utilized in the implementation of the method S70, it should be noted that the abrasive brush (such as abrasive brush 27a and 27b) shown in other embodiments can be used to realize the same method S70, When the abrasive brush 27a shown in FIGS. 11 and 12 is utilized to perform operation S72, the back side surface 91 of the semiconductor wafer 9 is polished by the abrasive tape 30 and cleaned by the outer surface 290a of the brush member 29a. When the abrasive brush 27b shown in FIGS. 13 and 14 is utilized to perform operation S72, the back side surface 91 of the semiconductor wafer 9 is polished by the abrasive tape 30b and cleaned by regions of the outer surface 290b of the brush member 29b which are exposed by the through holes of the abrasive tape 30b.

It is noted that while the cleaning tank 20 is placed in a CMP system 1 for cleaning the backside of the semiconductor wafer, the embodiments of present disclosure is noted limited thereto. In some other embodiments, the cleaning tank 20 is positioned in located in a cleaning apparatus (not shown in figures) which is signature for wafer backside cleaning purpose. The semiconductor wafer may be sent to the cleaning apparatus before being sent to a lithography system in which the wafer is exposed to a radiation light.

Embodiments of methods and apparatus allow an improvement in flatness of the semiconductor wafer while the semiconductor wafer is held in a lithography system by sufficiently cleaning contaminations or particles on a backside of the semiconductor wafer. Since the photoresist layer on the semiconductor wafer can be exposed by suitable lithography parameter, an overlay error is reduced. Therefore, the product yield of the semiconductor wafer manufactured by the lithographic system is improved.

According to some embodiments of present disclosure, a method of performing a chemical mechanical polishing (CMP) process is provided. The method includes polishing, on a platen, a front-side surface of a semiconductor wafer. The method also includes moving the semiconductor wafer from the platen to a first cleaning module such that a cleaning brush of the first cleaning module faces the front-side surface of the semiconductor wafer and an abrasive brush of the first cleaning module, comprising an abrasive tape, faces a backside surface of the semiconductor wafer. The method further includes rotating the cleaning brush to clean the front-side surface of the semiconductor wafer by the cleaning brush. In addition, the method includes rotating the abrasive brush to polish the backside surface of the semiconductor wafer by abrasive grains formed on the abrasive tape.

According to some embodiments of present disclosure, a method of cleaning and polishing a backside surface of a semiconductor wafer is provided. The method includes placing an abrasive brush, comprising an abrasive tape wound around an outer surface of a brush member of the abrasive brush, on the backside surface of the semiconductor wafer. The method also includes rotating the brush member to polish the backside surface of the semiconductor wafer by abrasive grains formed on the abrasive tape and to clean the backside surface of the semiconductor wafer by the brush member which is not covered by the abrasive tape.

According to other embodiments of present disclosure, a cleaning module is provided. The cleaning module includes a cleaning brush rotatable about a first rotation axis. The cleaning module further includes an abrasive brush positioned adjacent to the cleaning brush and rotatable about a second rotation axis that is parallel to the first rotation axis. The abrasive brush comprises a brush member and an abrasive tape wound around an outer surface of the brush member and comprising a plurality of abrasive grains.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of cleaning and polishing a backside surface of a semiconductor wafer, comprising:
   placing an abrasive brush, comprising an abrasive tape wound around an outer surface of a brush member of the abrasive brush, on the backside surface of the semiconductor wafer, wherein the brush member is pliable and surrounds a rotation shaft of the abrasive brush; and
   rotating the rotation shaft of the abrasive brush so as to move the brush member to polish the backside surface of the semiconductor wafer by abrasive grains formed on the abrasive tape and to clean the backside surface of the semiconductor wafer by the brush member which is not covered by the abrasive tape.

2. The method as claimed in claim 1, wherein the abrasive tape has a strip shape and is wound into a helical shape surrounding the outer surface of the brush member.

3. The method as claimed in claim 1, wherein the abrasive tape has a rectangular shape and covers the outer surface of the brush member, wherein a plurality of through holes are formed on the abrasive tape, and the outer surface of the brush member is exposed by the through holes.

4. The method as claimed in claim 1, wherein the abrasive brush further comprises a plurality of protruding structures formed on the outer surface of the brush member, and the backside surface of the semiconductor wafer is also cleaned by the protruding structures.

5. The method as claimed in claim 1, further comprising:
   placing a cleaning brush, which is free of the abrasive grains, on a front-side surface of the semiconductor wafer; and
   rotating the cleaning brush to clean the front-side surface of the semiconductor wafer.

6. The method as claimed in claim 5, further comprising:
   applying a first thrust force to the cleaning brush toward the front-side surface of the semiconductor wafer;

applying a second thrust force to the abrasive brush toward the backside surface of the semiconductor, wherein the second thrust force is greater than the first thrust force.

7. A method, comprising:

performing a chemical mechanical and polishing (CMP) process on a semiconductor wafer; and cleaning the semiconductor wafer twice using two cleaning modules, wherein a first of the two cleaning modules comprises a cleaning brush and an abrasive brush, the abrasive brush is positioned adjacent to the cleaning brush and comprises a brush member and an abrasive tape formed on an outer surface of the brush member, the brush member is pliable and soft, and the abrasive tape comprises of a plurality of abrasive grains, wherein when the semiconductor wafer is cleaned, a front-side surface of the semiconductor wafer is cleaned by the cleaning brush, and a back side surface of the semiconductor wafer is polished by the abrasive grains of the abrasive brush.

8. The method as claimed in claim 7, further comprising:

applying a first thrust force to the cleaning brush toward the front-side surface of the semiconductor wafer; and applying a second thrust force to the abrasive brush toward the back side surface of the semiconductor wafer, wherein the second thrust force is greater than the first thrust force.

9. The method as claimed in claim 7, further comprising polishing a bottom bevel edge of the semiconductor wafer through the abrasive grains of the abrasive brush.

10. The method as claimed in claim 7, wherein the abrasive brush further comprises of a plurality of pliable and soft protruding structures formed on the outer surface of the brush member, when the semiconductor wafer is cleaned, the back side surface of the semiconductor wafer is polished by the abrasive grains and cleaned by the soft protruding structures simultaneously.

11. The method as claimed in claim 1, further comprising polishing a bottom bevel edge of the semiconductor wafer through the abrasive tape of the abrasive brush.

12. The method as claimed in claim 1, wherein there are a plurality of pliable and soft protruding structures formed on the outer surface of the brush member, wherein an outer surface of each of the protruding structures is higher than an outer surface of the abrasive tape relative to the outer surface of the brush member.

13. The method as claimed in claim 12, wherein when the abrasive brush is used to clean and polish the backside surface of the semiconductor wafer, the outer surface of at least one of the protruding structures is in contact with the backside surface of the semiconductor wafer earlier than the outer surface of the abrasive tape.

14. The method as claimed in claim 7, further comprising:

moving the semiconductor wafer from the first of the two cleaning modules to a second of the two cleaning modules such that two cleaning brushes in the second of the two cleaning modules, which are free of the abrasive grains, face the front-side surface and the back side surface of the semiconductor wafer; and rotating the two cleaning brushes in the second of the two cleaning modules to clean both the front-side surface and the back side surface of the semiconductor wafer.

15. The method as claimed in claim 10, wherein an outer surface of each of the protruding structures is higher than an outer surface of the abrasive tape relative to the outer surface of the brush member.

16. The method as claimed in claim 10, wherein when the abrasive brush is used to clean and polish the back side surface of the semiconductor wafer, an outer surface of at least one of the protruding structures is in contact with the back side surface of the semiconductor wafer earlier than the outer surface of the abrasive tape.

17. A method of cleaning and polishing a backside surface of a semiconductor wafer, comprising:

moving the semiconductor wafer to a cleaning module including a cleaning brush and an abrasive brush;

placing the cleaning brush on a front-side surface of the semiconductor wafer;

placing the abrasive brush, comprising an abrasive tape wound around an outer surface of a brush member of the abrasive brush, on the backside surface of the semiconductor wafer, wherein the brush member is pliable and surrounds a rotation shaft of the abrasive brush; and rotating the rotation shaft of the abrasive brush so as to move the brush member to polish the backside surface of the semiconductor wafer by abrasive grains formed on the abrasive tape and to clean the backside surface of the semiconductor wafer by the brush member which is free of the abrasive tape.

18. The method as claimed in claim 17, further comprising:

applying a first thrust force to the cleaning brush toward the front-side surface of the semiconductor wafer; and applying a second thrust force to the abrasive brush toward the backside surface of the semiconductor, wherein the second thrust force is greater than the first thrust force.

19. The method as claimed in claim 17, further comprising polishing a bottom bevel edge of the semiconductor wafer through the abrasive grains of the abrasive brush.

20. The method as claimed in claim 17, wherein the abrasive brush further comprises of a plurality of pliable and soft protruding structures formed on the outer surface of the brush member, when the semiconductor wafer is cleaned, the backside surface of the semiconductor wafer is polished by the abrasive grains and cleaned by the soft protruding structures simultaneously.

* * * * *